(12) United States Patent
Saitou

(10) Patent No.: US 6,727,119 B2
(45) Date of Patent: Apr. 27, 2004

(54) METHOD OF ENCAPSULATING A SEMICONDUCTOR DEVICE ATTACHED TO A WIRING SUBSTRATE USING SEALING RESIN

(75) Inventor: Takaki Saitou, Ayase (JP)

(73) Assignees: Renesas Technology Corp., Tokyo (JP); Hitachi Hokkai Semiconductor, Ltd., Tokyo (JP)

( * ) Notice: Subject to any disclaimer, the term of this patent is extended or adjusted under 35 U.S.C. 154(b) by 0 days.

(21) Appl. No.: 10/247,505

(22) Filed: Sep. 20, 2002

(65) Prior Publication Data

US 2003/0064549 A1 Apr. 3, 2003

(30) Foreign Application Priority Data

Sep. 28, 2001 (JP) ........................ 2001-302518

(51) Int. Cl.$^7$ ............................................... H01L 21/44
(52) U.S. Cl. ..................................................... 438/127
(58) Field of Search ................. 438/106, 108, 438/126, 127

(56) References Cited

U.S. PATENT DOCUMENTS

| | | | | |
|---|---|---|---|---|
| 6,207,475 B1 | * | 3/2001 | Lin et al. | 438/108 |
| 6,391,682 B1 | * | 5/2002 | Tsai et al. | 438/108 |
| 6,391,683 B1 | * | 5/2002 | Chiu et al. | 438/108 |
| 6,498,054 B1 | * | 12/2002 | Chiu et al. | 438/108 |

FOREIGN PATENT DOCUMENTS

JP        2000-138339        5/2000

* cited by examiner

*Primary Examiner*—Evan Pert
*Assistant Examiner*—Scott B. Geyer
(74) *Attorney, Agent, or Firm*—Miles & Stockbridge P.C.

(57) ABSTRACT

A projection is formed adjacent an inner periphery wall of a recess of a ceramic substrate and a nozzle is disposed so as to overhang corners of a first face of the projection. Thereafter, resin is dropped from the nozzle onto the corners of the projection, whereby the resin flows down along the corners onto a resin passage. After passing the resin passage, the resin is admitted between a bottom of the ceramic substrate and a driver to effect underfill sealing. Positioning the nozzle above the corners of the projection can be controlled relatively easily.

35 Claims, 18 Drawing Sheets

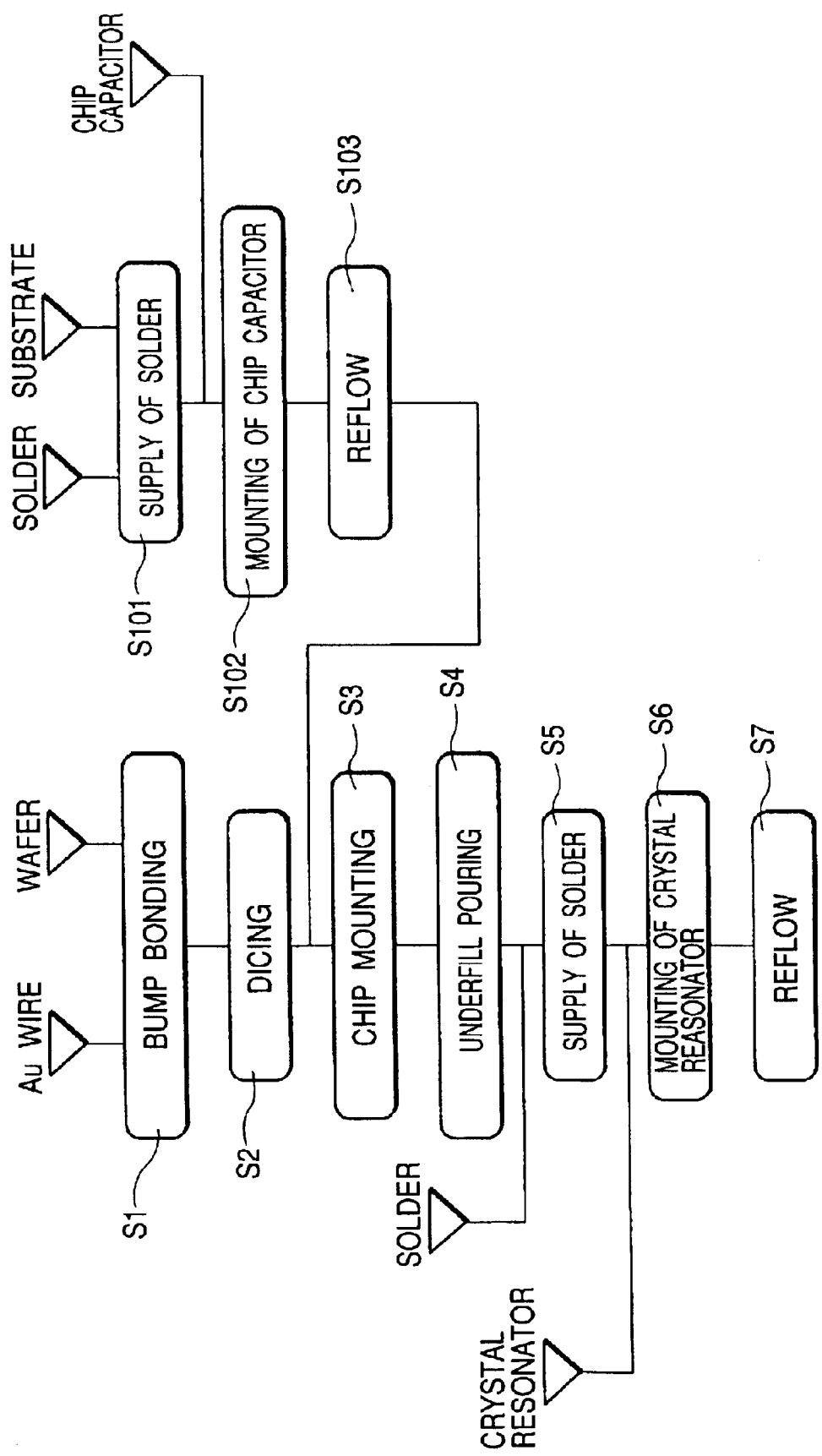

METHOD OF ENCAPSULATING A SEMICONDUCTOR DEVICE ATTACHED TO A WIRING SUBSTRATE USING SEALING RESIN

BACKGROUND OF THE INVENTION

The present invention relates to a semiconductor manufacturing technique and more particularly to a technique which is effectively applicable to underfill sealing in, for example, a crystal oscillator module with a crystal resonator mounted thereon.

In many of crystal oscillator modules with a crystal resonator mounted thereon, a semiconductor chip and chip components such as a chip capacitor are mounted on a wiring substrate having a recess.

More particularly, a semiconductor chip and a chip capacitor are mounted on a concave wiring substrate and an oscillator with a crystal resonator mounted thereon is stacked on the wiring substrate.

As to such a module wherein a semiconductor chip and a chip capacitor are mounted in a recess (also called a cavity) of a wiring substrate and an oscillator with a crystal resonator mounted thereon is stacked on the wiring substrate, a related description is found, for example, in Japanese Published Unexamined Patent Application No. 2000-138339, in which a chip capacitor is mounted between the walls of a recess and a semiconductor chip.

SUMMARY OF THE INVENTION

However, in connection with the crystal oscillator module of the aforesaid structure, the present invention has found out the following point. If the spacing between the walls of the recess and the semiconductor chip is narrowed with the intention of a further reduction of size and a chip capacitor is mounted into the semiconductor chip, there arises the following problem in underfill sealing. As the gap between the semiconductor chip and the walls becomes narrower, it becomes smaller than the diameter of a nozzle used for the potting of resin, or it becomes impossible to ensure a sufficient gap for stable insertion of the resin potting nozzle. To cope with such circumstances it has become necessary to effect the potting of resin from a position higher than the back surface of the semiconductor chip without inserting the resin potting nozzle into the chip-wall gap.

However, according to the finding of the present inventor, if an attempt is made to effect the potting of resin from a higher position than the back surface of the semiconductor chip, there arises a new problem that it becomes difficult to control the flow of resin.

More particularly, if the nozzle is displaced on the back surface of the semiconductor chip, the resin gets on the back surface of the chip, thus giving rise to the problem that the gap between a main surface of the chip and the wiring substrate cannot be sealed to a satisfactory extent. Further, if the nozzle is displaced onto a wall portion, the resin gets on the wall portion and contaminates electrodes formed on the wall portion, thus giving rise to the problem that it becomes impossible to ensure connection with the electrodes.

For effecting a highly accurate positioning of the nozzle to solve such problems, a long time is required for the positioning, with consequent prolongation of the time required for the manufacturing process. As another countermeasure, if there is used a finer nozzle to ensure a margin for the positioning, the potting speed of resin becomes lower because of using a fine nozzle, also resulting in that the time required for the manufacturing process becomes longer. Further, as long as the controllability for creating a stable resin flow is to be ensured, it is difficult to make the chip-wall gap narrower, thus obstructing the reduction in size of the semiconductor device.

It is an object of the present invention to provide a method of manufacturing a semiconductor device which can improve the workability for underfill sealing.

It is another object of the present invention to provide a method of manufacturing a semiconductor device which can attain the stabilization of underfill sealing.

It is a further object of the present invention to provide a method of manufacturing a semiconductor device which can attain the reduction of the manufacturing cost.

The above and other objects and novel features of the present invention will become apparent from the following description and the accompanying drawings.

Typical inventions disclosed herein will be outlined below.

According to the present invention there is provided a method of manufacturing a semiconductor device, comprising the steps of providing a wiring substrate, the wiring substrate having a recess, a stepped portion and a resin passage, the stepped portion being formed in part of a surrounding portion of an opening of the recess and having a first face higher than a bottom of the recess, the resin passage being adjacent to the stepped portion and contiguous to the bottom of the recess; providing a semiconductor chip having salient electrodes; flip-chip-connecting the semiconductor chip to the recess of the wiring substrate; disposing a nozzle so as to partially overhang a corner portion of the first face of the stepped portion; and dropping the resin from the nozzle onto the corner portion of the stepped portion, allowing the resin to be admitted between the bottom of the wiring substrate and the semiconductor chip through the resin passage.

BRIEF DESCRIPTION OF THE DRAWINGS

FIG. 36 is a manufacturing process flow chart showing an example of an assembling procedure in a method of manufacturing the crystal oscillator module illustrated in FIG. 33.

DETAILED DESCRIPTION OF THE PREFERRED EMBODIMENTS

Figure 1:
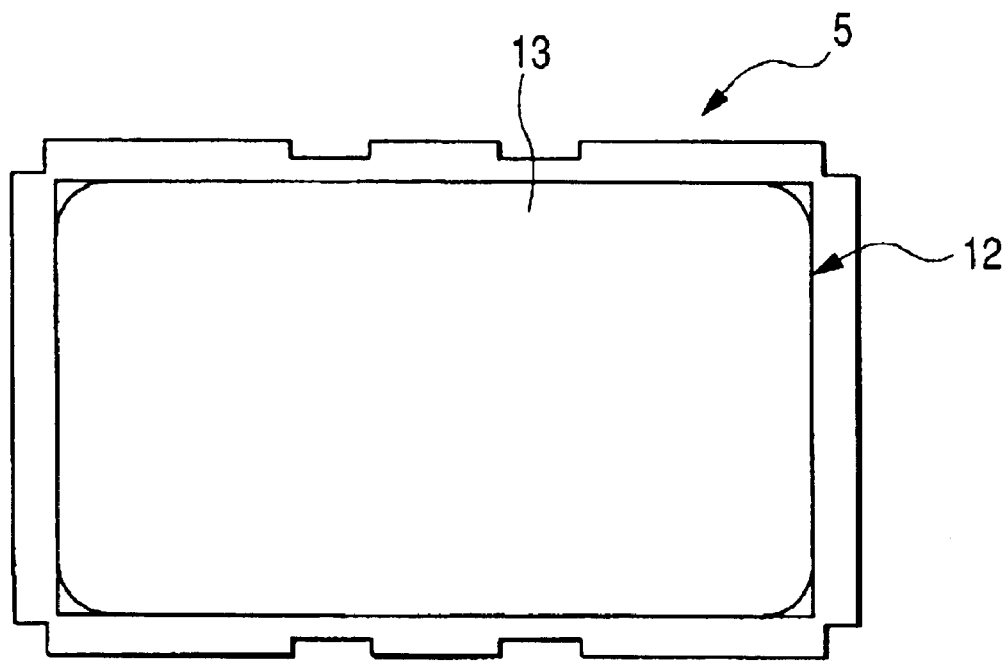
FIG. 1 is a plan view showing an external structure of a crystal oscillator module as a semiconductor device according to a first embodiment of the present invention.

Embodiments of the present invention will be described in detail hereinunder with reference to the accompanying drawings. In all of the drawings for illustrating the embodiments, components having the same functions are identified by the same reference numerals, and repeated explanations thereof will be omitted.

(First Embodiment)

Figure 2:
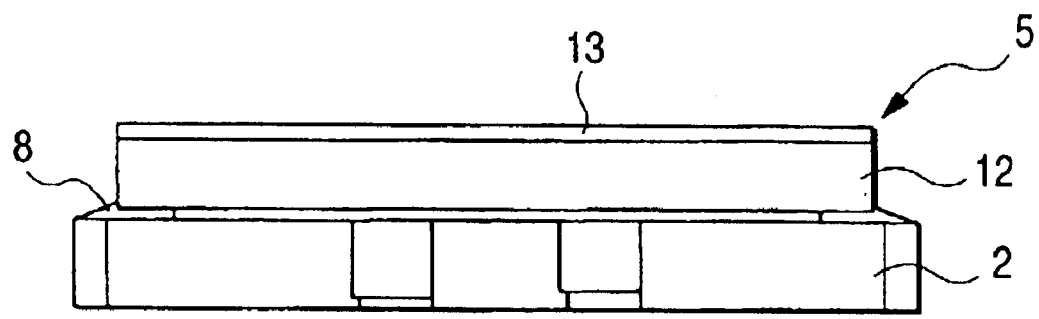
FIG. 2 is a longitudinal side view showing an external structure of the crystal oscillator module illustrated in FIG. 1.
Figure 3:
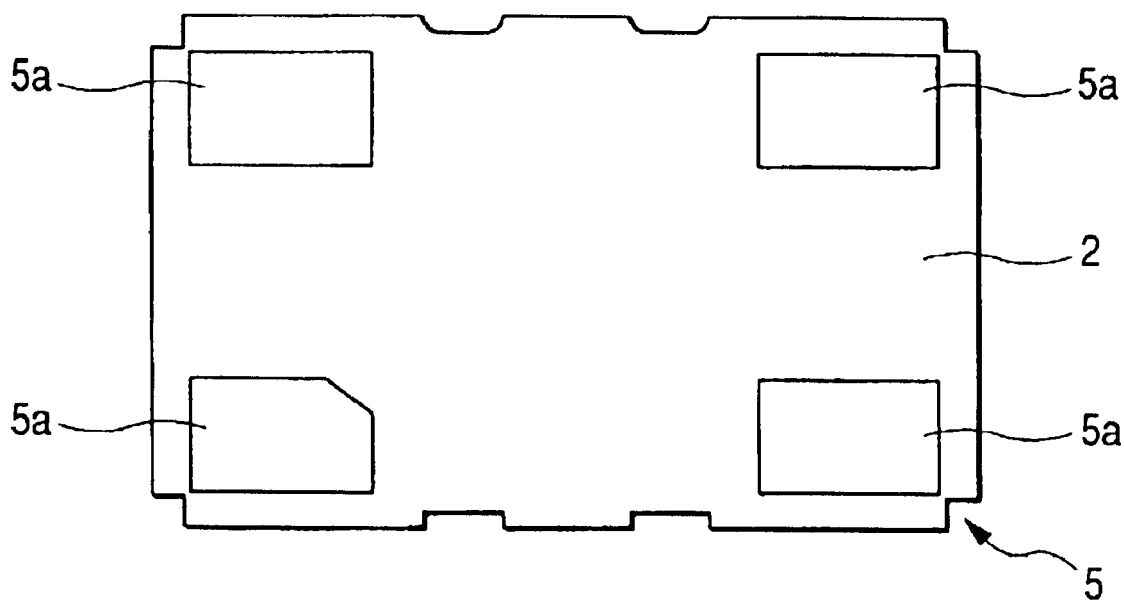
FIG. 3 is a bottom view showing an external structure of the crystal oscillator module illustrated in FIG. 1.
Figure 4:
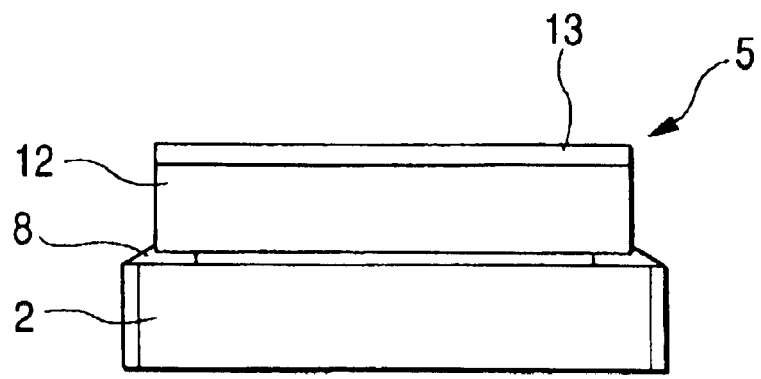
FIG. 4 is a transverse side view showing an external structure of the crystal oscillator module illustrated in FIG. 1.
Figure 5:
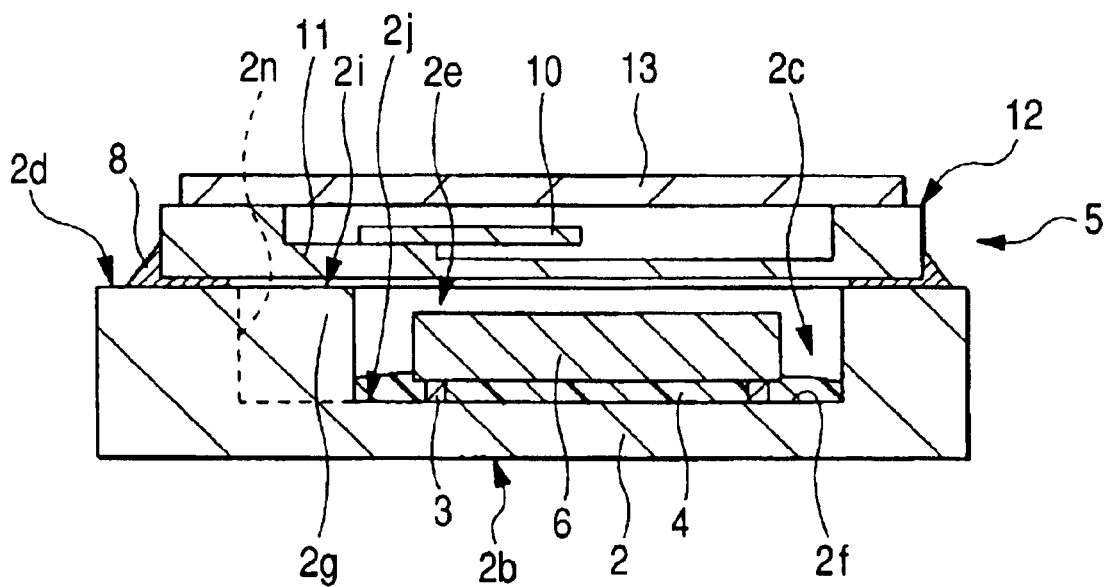
FIG. 5 is a sectional view showing an internal structure of the crystal oscillator module illustrated in FIG. 1.
Figure 6:
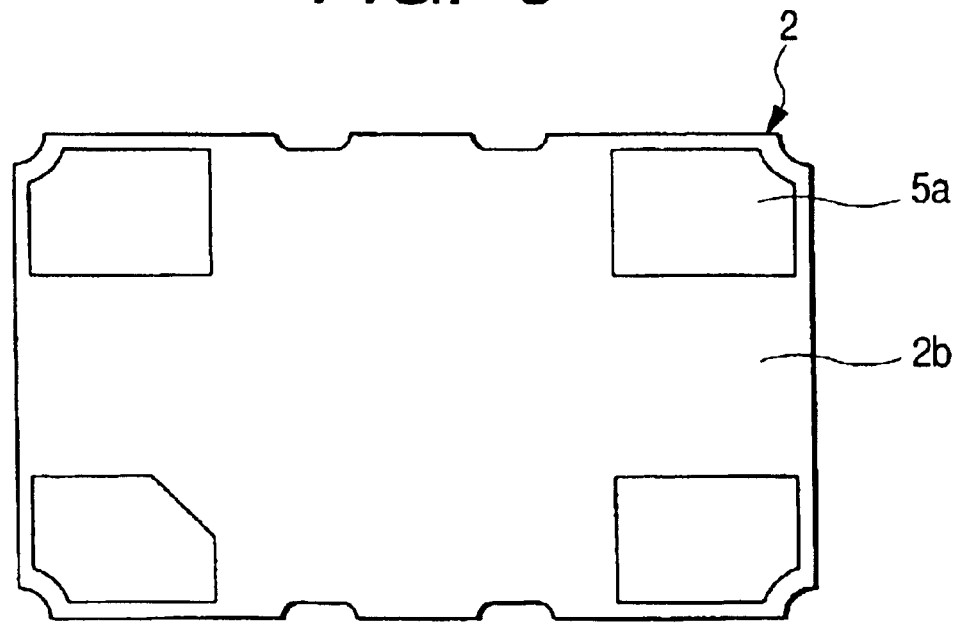
FIG. 6 is a bottom view showing the structure of a wiring substrate in the crystal oscillator module illustrated in FIG. 1.
Figure 7:
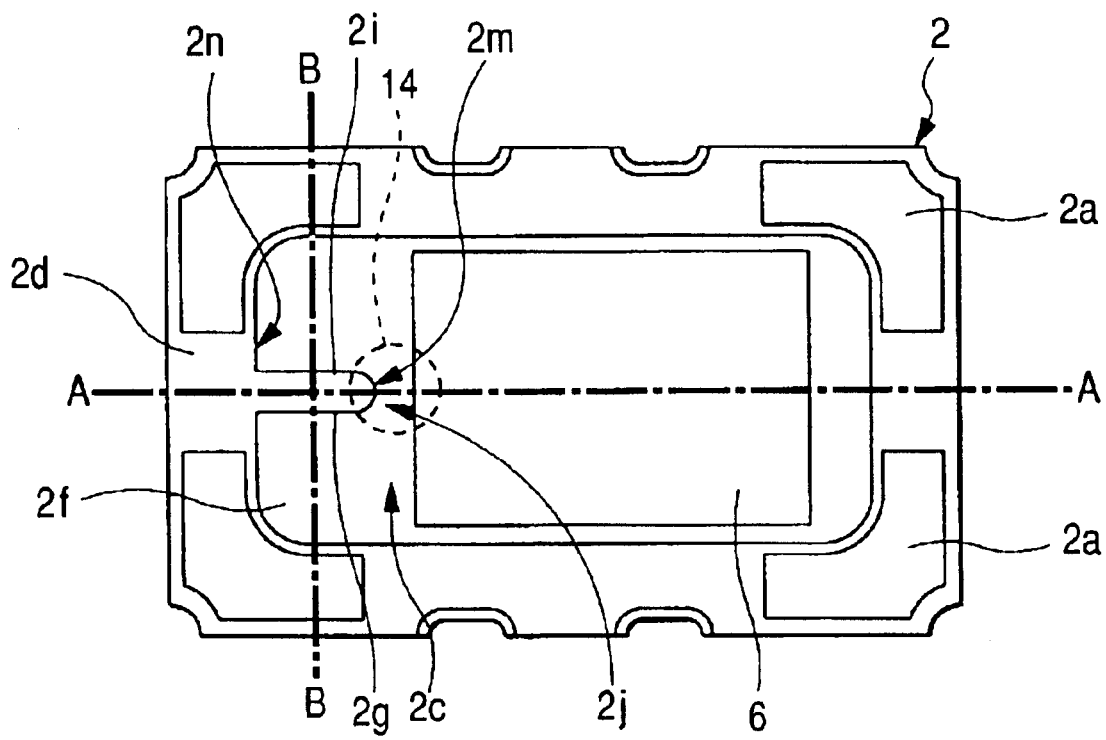
FIG. 7 is a plan view showing an internal structure of the wiring substrate illustrated in FIG. 6.
Figure 8:
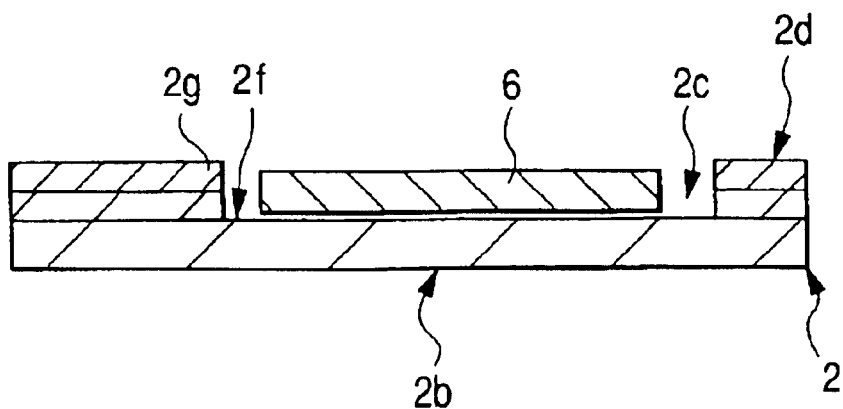
FIG. 8 is a sectional view showing a sectional structure taken along line A—A in FIG. 7.
Figure 9:
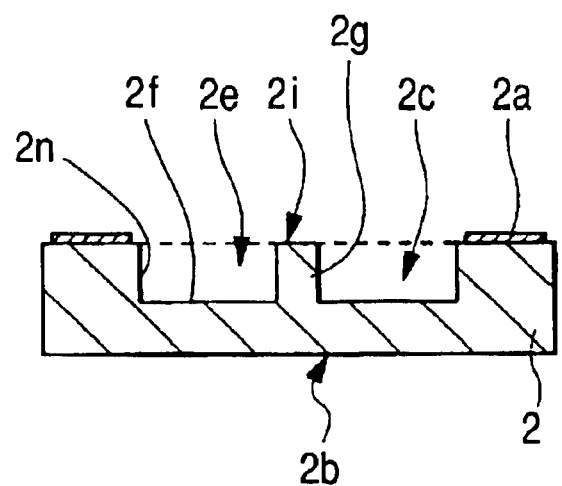
FIG. 9 is a sectional view showing a sectional structure taken along line B—B in FIG. 7.
Figure 10:
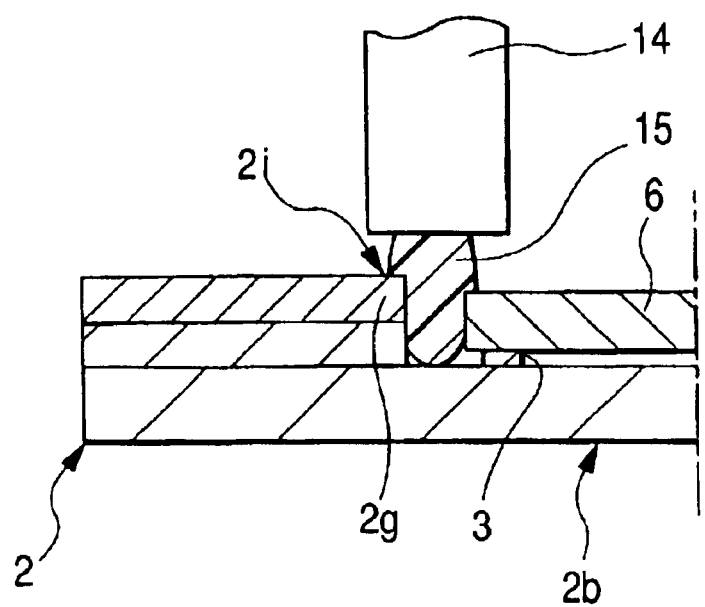
FIG. 10 is a partial sectional view showing an example of a positional relation among a projection, a semiconductor chip, and a nozzle in the sectional structure illustrated in FIG. 8.
Figure 11:
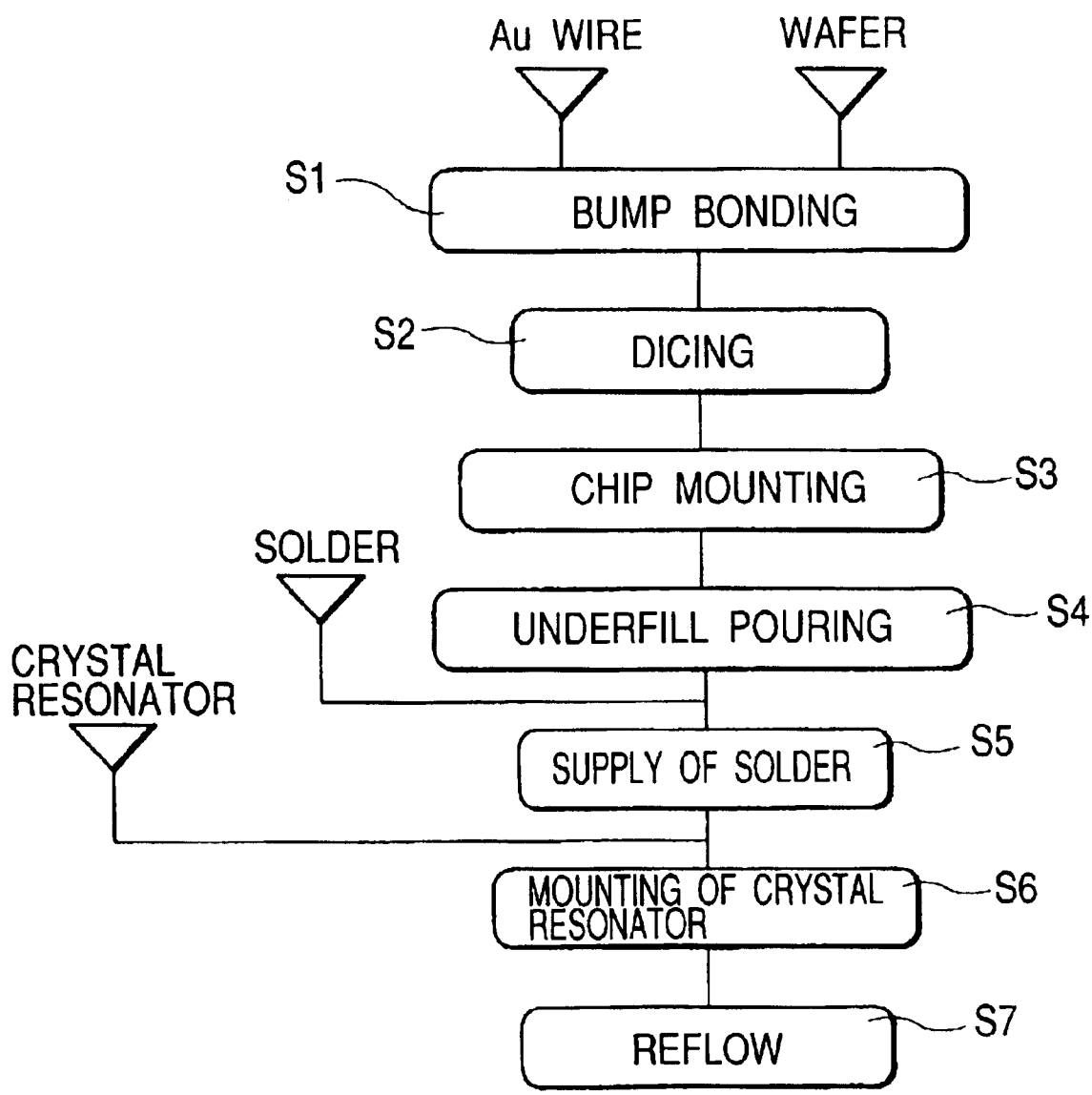
FIG. 11 is a manufacturing process flow chart showing an example of an assembling procedure in a method of manufacturing the crystal oscillator module illustrated in FIG. 1.
Figure 12:
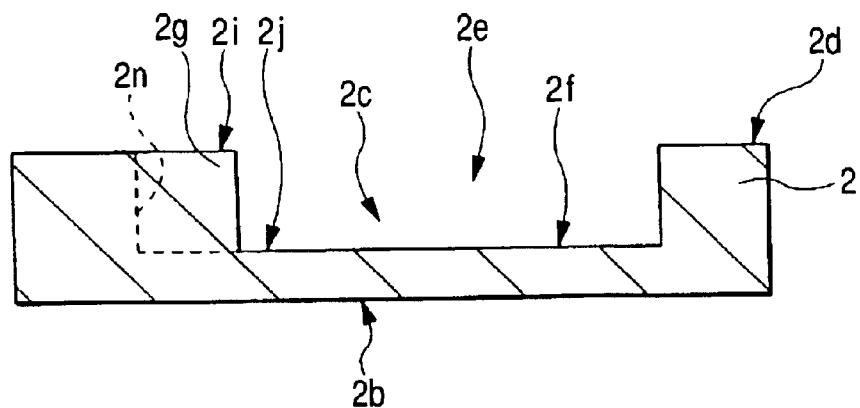
FIG. 12 is a sectional view showing an example of a substrate providing step in the assembling procedure illustrated in FIG. 11.
Figure 13:
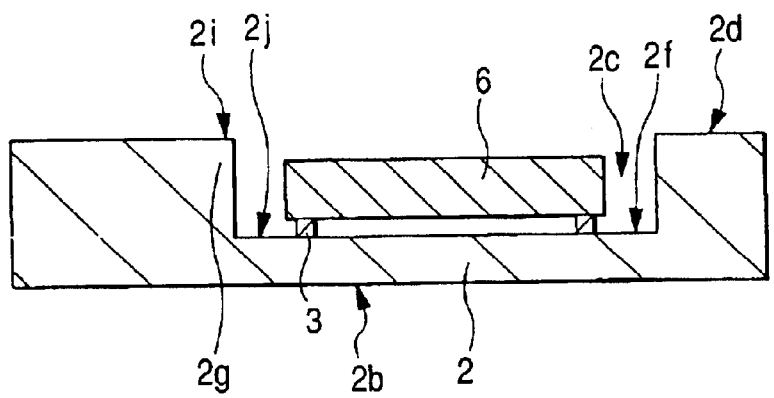
FIG. 13 is a sectional view showing an example of a chip mounting step in the assembling procedure illustrated in FIG. 11.
Figure 14:
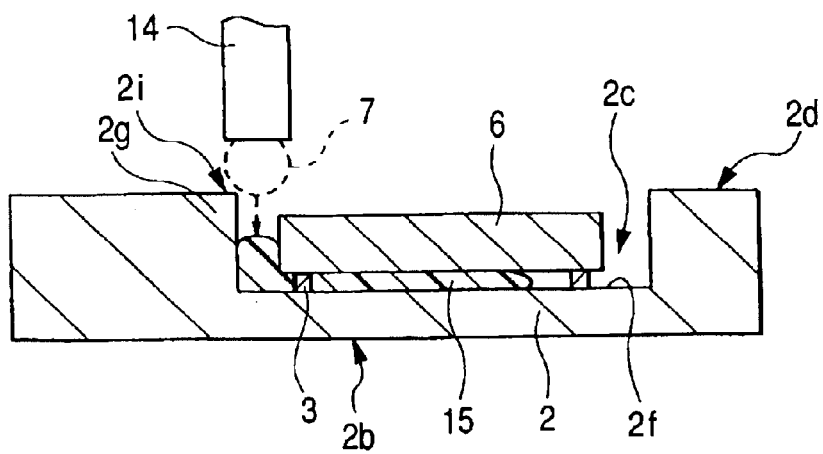
FIG. 14 is a sectional view showing an example of an underfill sealing step in the assembling procedure illustrated in FIG. 11.
Figure 15:
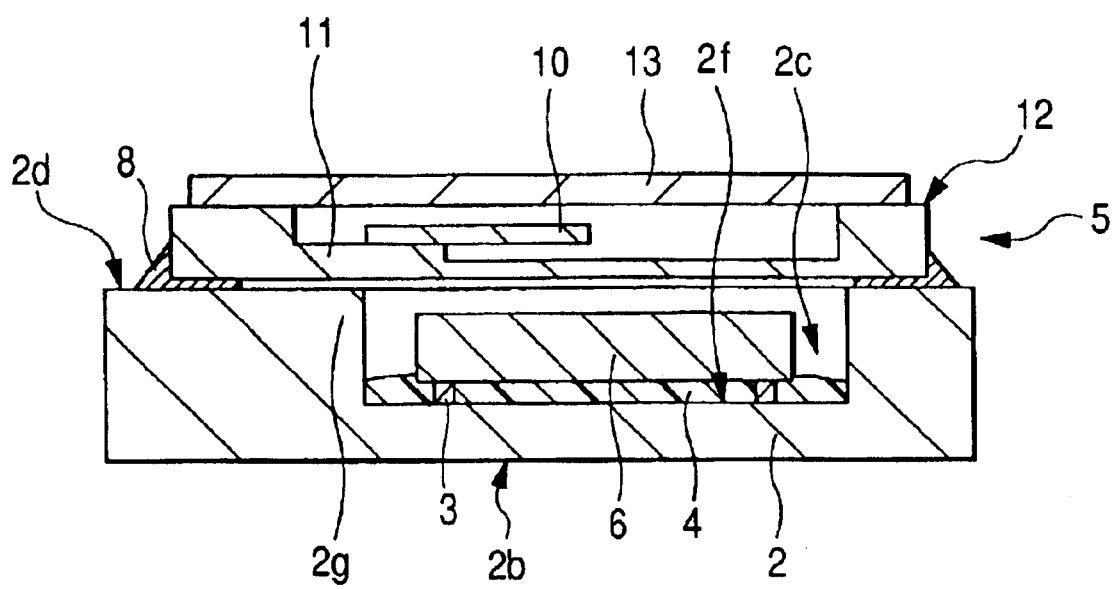
FIG. 15 is a sectional view showing an example of a crystal vibrator mounting step in the assembling procedure illustrated in FIG. 11.

FIG. 1 is a plan view showing an external structure of a crystal oscillator module as a semiconductor device according to a first embodiment of the present invention, FIG. 2 is a longitudinal side view showing an external structure of the crystal oscillator module illustrated in FIG. 1, FIG. 3 is a bottom view showing an external structure of the crystal oscillator module illustrated in FIG. 1, FIG. 4 is a transverse side view showing an external structure of the crystal oscillator module illustrated in FIG. 1, FIG. 5 is a sectional view showing an internal structure of the crystal oscillator module illustrated in FIG. 1, FIG. 6 is a bottom view showing the structure of a wiring substrate used in the crystal oscillator module illustrated in FIG. 1, FIG. 7 is a plan view showing an internal structure of the wiring substrate illustrated in FIG. 6, FIG. 8 is a sectional view showing a sectional structure taken along line A—A in FIG. 7, FIG. 9 is a sectional view showing a sectional structure taken along line B—B in FIG. 7, FIG. 10 is a partial sectional view showing an example of a positional relation among a projection, a semiconductor chip, and a nozzle in the sectional structure illustrated in FIG. 8, FIG. 11 is a manufacturing process flow chart showing an example of an assembling procedure in a method of manufacturing the crystal oscillator module illustrated in FIG. 1, FIG. 12 is a sectional view showing an example of a substrate providing step in the assembling procedure illustrated in FIG. 11, FIG. 13 is a sectional view showing an example of a chip mounting step in the assembling procedure illustrated in FIG. 11, FIG. 14 is a sectional view showing an example of an underfill sealing step in the assembling procedure illustrated in FIG. 11, and FIG. 15 is a sectional view showing an example of a crystal resonator mounting step in the assembling procedure illustrated in FIG. 11.

A semiconductor device according to this first embodiment illustrated in FIG. 1 carries thereon a crystal resonator 10 shown in FIG. 5 and a driver IC 6 as a semiconductor chip, with a circuit for driving the crystal resonator 10 and a capacitor circuit being incorporated in the driver IC. The semiconductor device is an oscillator installed mainly in a portable communication device (e.g., a portable telephone or a portable notebook-size personal computer). It corresponds to a crystal oscillator module 5 (also called a ceramic package) as a semiconductor package form.

A schematic construction of the crystal oscillator module 5 according to this first embodiment illustrated in FIGS. 1 to 5 will now be described with reference to FIGS. 1 to 10. The crystal oscillator module 5 is made up of an oscillator 12 with a crystal resonator 10 incorporated therein, a driver IC 6 in which are incorporated a circuit for driving the crystal resonator 10 and a capacitor circuit, a ceramic substrate 2 as a wiring substrate having a recess 2c for supporting the driver IC 6, gold bumps 3 as salient electrodes which connect the driver IC 6 and the ceramic substrate 2 with each other, and a sealing portion 4 formed by a sealing resin 15 which cures after being poured between the driver IC 6 and a bottom 2f of the recess 2c by underfill sealing.

In the crystal oscillator module 5, as shown in FIG. 5, the oscillator 12 having the crystal resonator 10 is stacked on the ceramic substrate 2 as a multi-layer substrate with the driver IC mounted in the recess 2c, and in the recess 2c of the ceramic substrate 2 is formed a projection 2g as a portion onto which the underfill sealing resin shown in FIG. 10 is dropped when underfill sealing is performed.

More specifically, as shown in FIGS. 6 to 10, the ceramic substrate 2, which is a concave multi-layer substrate having wiring lines, comprises a recess 2c as a cavity, a projection 2g adjacent to an inner periphery wall 2n of the recess 2c and having a first face 2i higher than the bottom 2f of the recess 2c, with resin 15 being dropped onto the projection 2g, and a resin passage 2j formed on the bottom 2f adjacently to the projection 2g.

As shown in FIG. 7, the projection 2g used in this first embodiment is an elongated projection projecting from the inner periphery wall 2n and extending inwards within the recess 2c of the ceramic substrate 2. Arcuate corners 2m are formed at an inner end of the first face 2i. The height of the projection 2g from the bottom 2f is the same as the height of the inner periphery wall 2n, as shown in FIG. 9.

Therefore, when the driver IC 6 is mounted, the 0projection 2g and the driver IC 6 are in such a relation of height from the bottom 2f as shown in FIGS. 8 and 10, in which the projection 2g is slightly higher than the driver IC.

The shape of the corners 2m of the first face 2i of the projection 2g is not limited to the arcuate shape. For example, the corners 2m may each comprise two different sides.

As shown in FIG. 7, the size in the transverse direction of the elongated projection 2g is smaller than the diameter of a nozzle 14. Therefore, when the nozzle 14 is positioned on the inner end of the projection 2g in underfill sealing, the nozzle 14 overhangs the inner end of the first face 2i of the projection 2g, so that it becomes easy to drop the resin 15 onto the corners 2m of the first face 2i of the projection 2g.

In the ceramic substrate 2 used in this first embodiment, since the width of the projection 2g is narrower than the diameter of the nozzle 14, the two corners 2m formed at the inner end of the first face 2i of the projection 2g, i.e., the arcuately contiguous both-side corners 2m at the inner end of the first face 2i of the projection 2g, can be positioned just under the nozzle 14.

The resin passage 2j adjacent to the projection 2g is a space to which the resin 15 shown in FIG. 10 flows down after being dropped onto the corners 2m of the projection 2g. The resin 15 which has flowed down to the resin passage 2j passes the same passage and gets in between the bottom 2f of the ceramic substrate 2 and the driver IC 6, thus effecting underfill sealing to form the sealing portion 4 shown in FIG. 5.

As shown in FIG. 7, since the elongated projection 2g is formed in part of the recess 2c, the driver IC 6 is flip-chip-connected in the recess 2c at a position offset in a direction leaving the projection 2g.

An edge portion 2d, which is contiguous to the first face 2i of the projection 2g, is formed around an opening 2e of the recess 2c and connecting terminals 2a for oscillator are provided at four corners of the edge portion 2d. The oscillator 12 is connected to the connecting terminals 2a through solder 8 for oscillator.

More specifically, the oscillator 12 having the crystal resonator 10 is mounted on the edge portion 2d of the ceramic substrate 2. The oscillator 12 comprises the crystal resonator 10, a resonator substrate 11 which carries the crystal resonator 10 thereon, and a cap 13 which covers the crystal resonator 10.

For example, the ceramic substrate 2 is formed by a multi-layer laminate of green sheets.

The driver IC 6 mounted in the recess 2c of the ceramic substrate 2 is Au—Au-connected by the gold bumps 3.

The sealing resin 15 for forming the sealing portion 4 by underfill sealing is, for example, a thermosetting epoxy resin for potting.

On a back surface 2b of the ceramic substrate 2 in the crystal oscillator module 5, which back surface is a non-mounting side opposite to the oscillator-mounting side, there are formed external terminals 5a of the crystal oscillator module 5 so as to be positioned at four corners of the back surface, as shown in FIG. 3.

Next, a method of manufacturing the semiconductor device (crystal oscillator module 5) of this first embodiment will be described below in accordance with the manufacturing process flow chart shown in FIG. 11.

First, in step S1 shown in FIG. 11, bump bonding is performed using Au wires to bond bumps to surface electrodes formed on each semiconductor chip area on a semiconductor wafer.

Through this bump bonding step it is possible to provide a semiconductor wafer with gold bumps 3 (salient electrodes) attached beforehand to each semiconductor chip area.

Subsequently, in step S2 there is performed dicing for each semiconductor chip area on the semiconductor wafer to divide the wafer into individual semiconductor chips as driver ICs 6.

Then, there is performed mounting of each of the chips as in step S3.

First, such a ceramic substrate 12 as shown in FIG. 12 is provided.

To be more specific, there is provided a ceramic substrate 12 as a concave wiring substrate, the ceramic substrate 12 having a recess 2c as a cavity capable of receiving the driver IC 6 therein, such as that shown in FIGS. 6 to 9, a first face 2i adjacent to an inner periphery wall 2n of the recess 2c and higher than a bottom 2f of the recess, a projection 2g onto which the resin 15 is dropped, and a resin passage 2j formed on the bottom 2f adjacently to the projection 2g.

Next, as shown in FIG. 13, the driver IC 6 is disposed within the recess 2c of the ceramic substrate 2.

In this case, the driver IC 6 is disposed at an offset position spaced apart from the projection 2g and is flip-chip-connected there to the recess, whereby even in a small-sized semiconductor device it is possible to ensure a larger area of the portion serving as the resin passage 2j.

Thus, the driver IC 6 is flip-chip-connected in the recess 2c at a position offset in a direction leaving the projection 2g.

In the flip chip connection, ultrasonic wave or pressure is applied to the driver IC 6 and both driver IC 6 and ceramic substrate 2 are connected together by Au—Au connection through gold bumps 3.

As a result, the driver IC 6 is mounted offsetwise in the recess 2c of the ceramic substrate 2, as shown in FIG. 13.

Thereafter, underfill pouring performed as in step S4.

More specifically, a sealing resin such as a thermosetting epoxy resin is dropped (potting) into the recess 2c of the ceramic substrate 2 and is admitted between the driver IC 6 and the bottom 2f of the recess 2c, thereby effecting underfill sealing.

In the semiconductor device manufacturing method according to this first embodiment, the underfill sealing is performed by disposing the nozzle 14 at a position higher than the projection 2g and driver IC 6 and dropping the resin 15 from that position. In this connection there are made various improvements.

First, as shown in FIG. 7, the nozzle 14 is disposed so as to partially overhang the corners 2m of the first face 2i of the projection 2g formed in the recess 2c.

That is, there is made positioning of the nozzle 14 so that in the potting operation the resin 15 drops at least onto the corners 2m of the projection 2g.

Therefore, it is preferable that the area of the projection 2b be not larger than the sectional area of the nozzle 14. If the area of the projection 2g is not larger than the sectional area of the nozzle 14, the operation for positioning the nozzle 14 at least above the corners 2m of the projection 2g is a relatively easy operation and thus the positioning of the nozzle 14 can be done easily.

Further, when dropping the resin 15 from the nozzle 14, such a resin ball 7 as shown in FIG. 14 is formed at the nozzle tip, and in this connection it is preferable that the area of the projection 2g be not larger than the sectional area of the resin ball 7. If the area of the projection 1g is not larger than the sectional area of the resin ball 7, it is relatively easy to dispose the resin ball at least on the corners 2m of the projection 2g and, like the aforesaid case, it is possible to effect positioning of the nozzle 14 easily.

The nozzle 14 may be positioned so as to overhand both the corners 2m of the first face 2i of the projection 2g and an end portion of the driver IC 6 as in FIG. 7 and the resin 15 may be dropped onto the corners 2m of the projection 2g and the end portion of the driver IC 6 as in FIG. 10.

Also in this case it is relatively easy to dispose the nozzle 14 so as to overhang at least both the corners 2m of the projection 2g and the driver IC 6, so that the positioning of the nozzle 14 can be done easily. Besides, the dropped resin 15 flows down smoothly along and between the projection 2g and the driver IC 6, then passes the resin passage 2j and gets in between the bottom 2f of the recess 2c and the driver IC 6.

The nozzle 14 may be disposed in such a manner that the area of the nozzle overhanging the resin passage 2j contiguous to the bottom 2f is larger than the area thereof overhanging the projection 2g. By so doing, the resin 15 can be dropped accurately onto at least the corners 2m of the first face 2i of the projection 2g.

Thus, in the underfill sealing operation according to this first embodiment, the nozzle 14 is positioned so as to overhand at least the corners 2m of the first face 2i of the projection 2g formed in the recess 2c of the ceramic substrate 2, thereafter the resin 15 is dropped onto the corners 2m of the projection 2g, whereby the resin 15 flows down along the corners 2m onto the resin passage 2j, then after passing the resin passage, flows between the bottom 2f of the recess 2c and the driver IC 6.

Thus, the positioning of the nozzle 14 above the corners 2m of the projection 2g does not require a high accuracy, but can be controlled relatively easily, so that much time and labor are no longer required for the underfill sealing work and it is possible to improve the working efficiency thereof.

Moreover, as shown in FIG. 14, since the first face 2i of the projection 2g is slightly higher than the surface of the driver IC 6, the resin ball 7 first contacts the projection 2g at the time of dropping the resin 15 from the nozzle 14.

As a result, the resin 15 begins to flow along the corners 2m of the projection 2g and toward the resin passage 2j, so that the amount of the resin applied onto the surface of the driver IC 6 is only small, but the resin can be admitted between the bottom 2f of the recess 2c and the driver IC 6 through the resin passage 2j.

Consequently, it is possible to stabilize the underfill sealing.

Besides, since the underfill sealing can be stabilized, selection of resin material having high reliability independent of its flowability with respect to the resin 15 for underfill sealing.

Further, positioning of the nozzle 14 can be easily carried out, it becomes possible to ease working conditions and hence possible to reduce the manufacturing cost. Moreover, since the projection 2g is smaller than the nozzle 14, it is possible to prevent the resin 15 dropping from the nozzle 14 from flowing a large quantity onto the edge portion 2d from the projection 2g and contaminating the connecting terminals 2a for oscillator disposed on the edge portion. In other words, since the projection 2g is smaller than the nozzle 14, it is possible to make control so that the resin 15 flows more stably between the driver IC 6 and the recess 2c of the ceramic substrate 2 through the resin passage 2j.

Thereafter, as in step S5, solder is supplied to the connecting terminals 2a for oscillator which terminals are electrodes formed on the edge portion 2d of the ceramic substrate 2, followed by mounting of the crystal resonator (step S6) in which the oscillator 12 is disposed on the edge portion 2d.

The oscillator 12 is made up of the resonator substrate 11 which carries the crystal resonator 10 thereon and the cap 13 which seals the substrate.

Subsequently, reflow is carried out as in step S7 to connect the oscillator 12 to the edge portion 2d of the ceramic substrate 2 through the solder 8 for oscillator.

Next, a description will be given below about a modification of the first embodiment.

Figure 16:
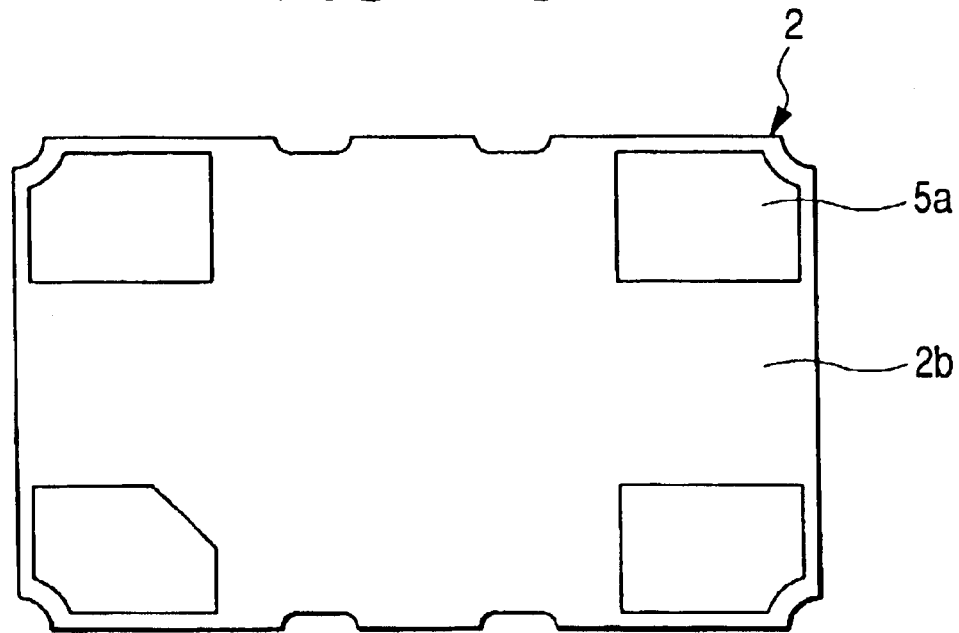
FIG. 16 is a bottom view showing the structure of a wiring substrate used in a crystal oscillator module according to a modification of the first embodiment of the present invention.
Figure 17:
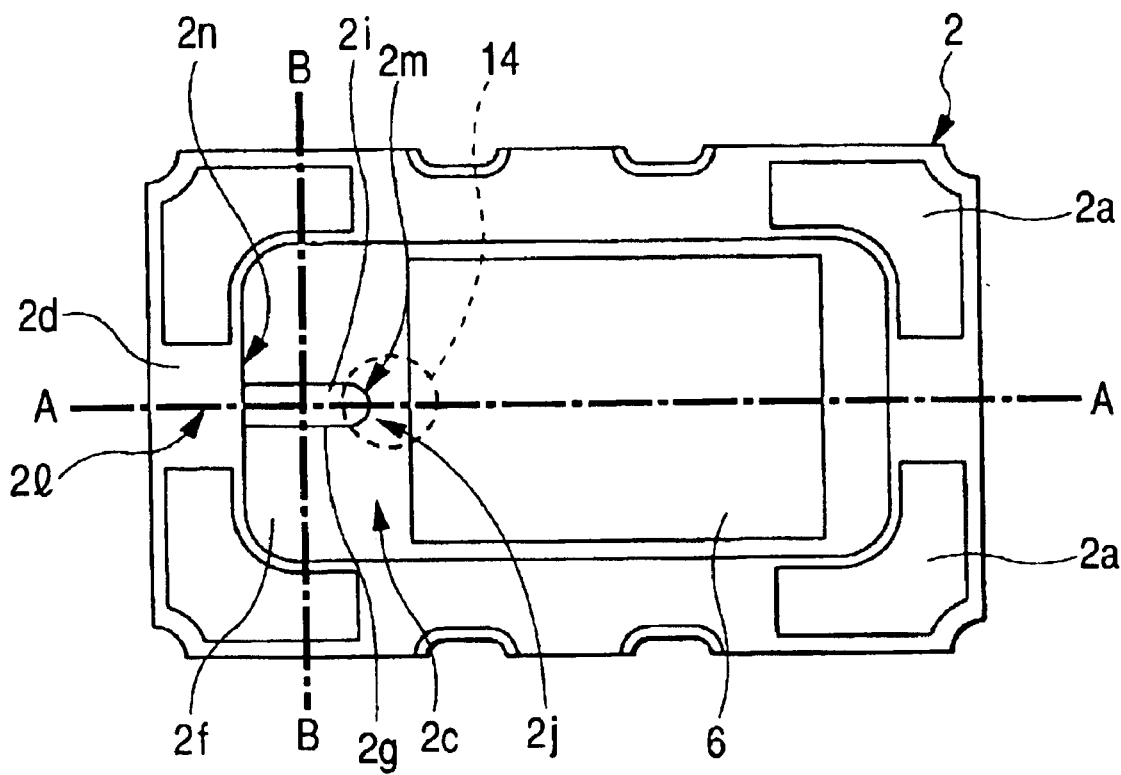
FIG. 17 is a plan view showing an internal structure of the wiring substrate illustrated in FIG. 16.
Figure 18:
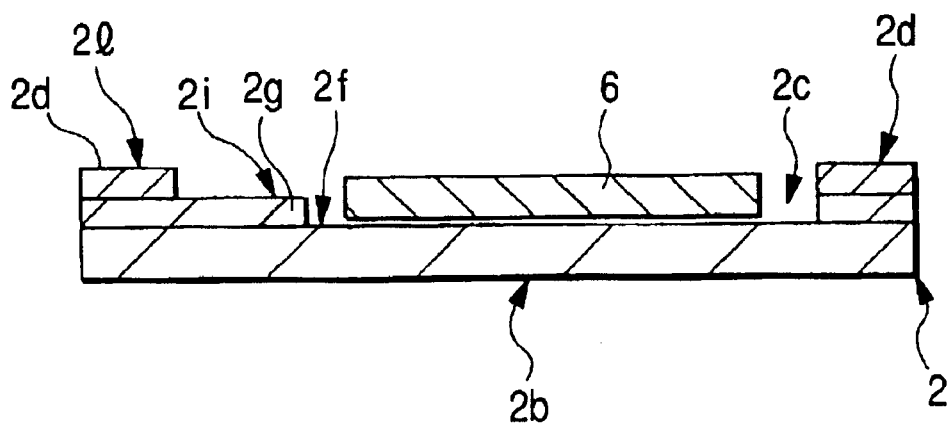
FIG. 18 is a sectional view showing a sectional structure taken along line A—A in FIG. 17.
Figure 19:
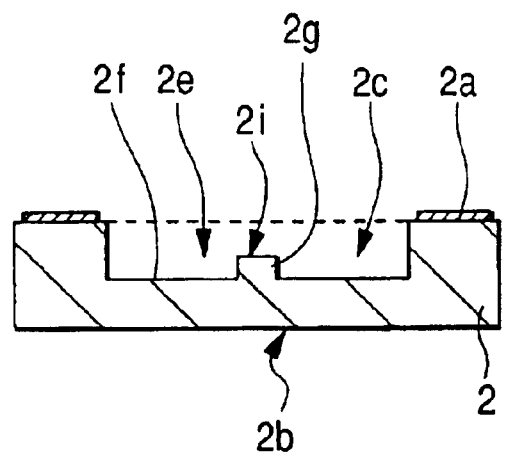
FIG. 19 is a sectional view showing a sectional structure taken alone line B—B in FIG. 17.
Figure 20:
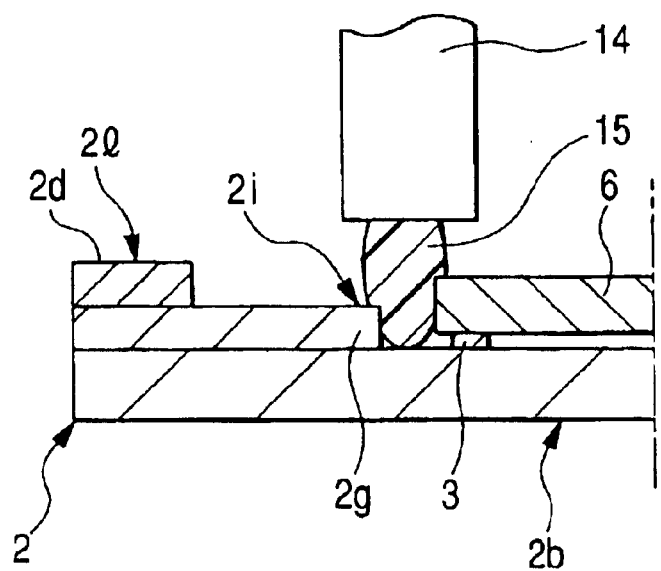
FIG. 20 is a partial sectional view showing an example of a positional relation among a projection, a semiconductor chip, and a nozzle in the sectional structure illustrated in FIG. 18.

FIG. 16 is a bottom view showing the structure of a wiring substrate used in a crystal oscillator module according to a modification of the first embodiment of the present invention, FIG. 17 is a plan view showing an internal structure of the wiring substrate illustrated in FIG. 16, FIG. 18 is a sectional view showing a sectional structure taken along line A—A in FIG. 17, FIG. 19 is a sectional view showing a sectional structure taken along line B—B in FIG. 17, and FIG. 20 is a partial sectional view showing an example of a positional relation among a projection, a semiconductor chip, and a nozzle in the sectional structure illustrated in FIG. 18.

In a ceramic substrate 2 according to this modification shown in FIGS. 16 to 20, the height of a projection 2g is set smaller than that of an inner periphery wall 2n of a recess 2c.

More specifically, the height of a first face 2i of the projection 2g adjacent to the inner periphery wall 2n of the recess 2c is smaller than the height of an edge portion 2d. As a result, the height of the first face 2i of the projection 2g is smaller than the height of the surface of the driver IC 6.

In other words, around an opening 2e of the recess 2c adjacent to the projection 2g, a second face 21 higher than the first face 2i of the projection 2g is formed in the edge portion 2d, and connecting terminals 2a (electrodes) for oscillator are formed at four corners of the second face 21.

Therefore, the oscillator 12 having the crystal resonator 10 is connected to the oscillator connecting terminals 2a through solder 8 for oscillator.

With use of the ceramic substrate 2 according to the modification shown in FIGS. 16 to 20, since the second face 21 of the edge portion 2d of the recess 2c is higher than the first face 2i of the projection 2g, it is possible to prevent resin 15 from flowing out onto the edge portion 2d when it is dropped onto the projection 2g and hence possible to prevent the oscillator connecting terminals 2a on the second face 21 of the edge portion 2d from being stained by the resin.

In connection with using the ceramic substrate 2 shown in FIGS. 16 to 20, other structural points and how to manufacture the semiconductor device, as well as other effects, are the same as in the use of the ceramic substrate shown in FIGS. 6 to 10, so tautological explanations thereof will here be omitted.

(Second Embodiment)

Figure 21:
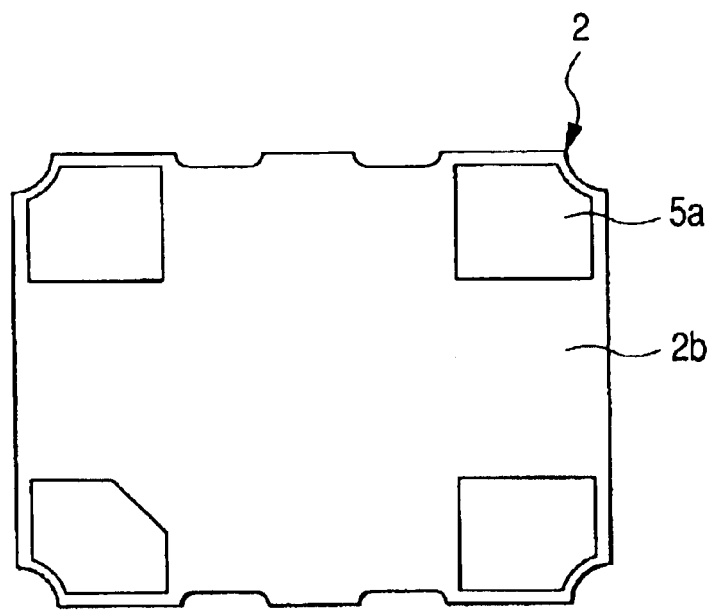
FIG. 21 is a bottom view showing the structure of a wiring substrate used in a crystal oscillator module according to a second embodiment of the present invention.
Figure 22:
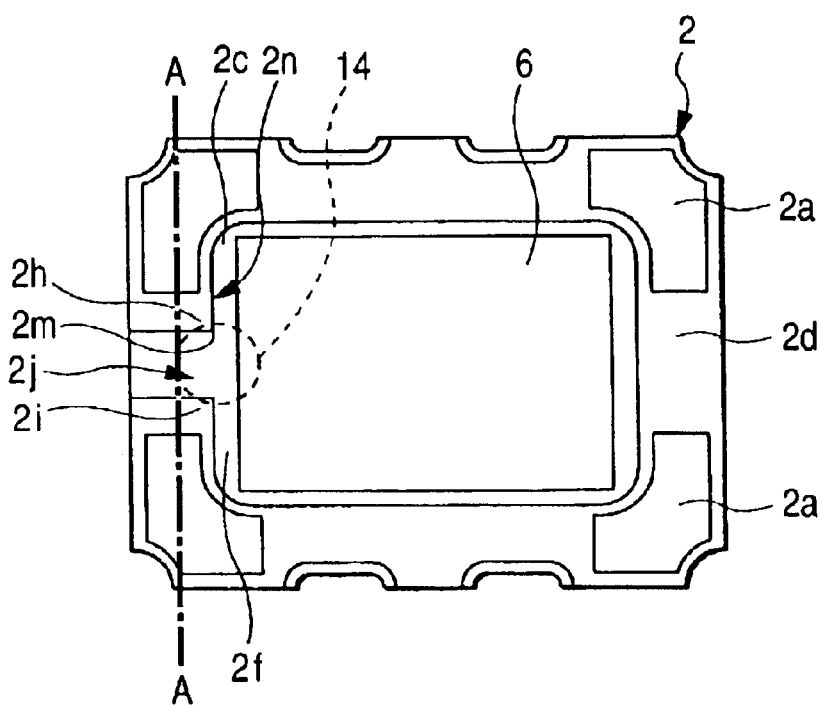
FIG. 22 is a plan view showing an internal structure of the wiring substrate illustrated in FIG. 21.
Figure 23:
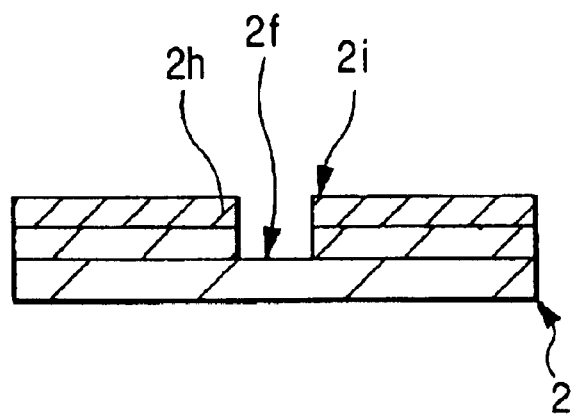
FIG. 23 is a sectional view showing a sectional structure taken along line A—A in FIG. 22.
Figure 24:
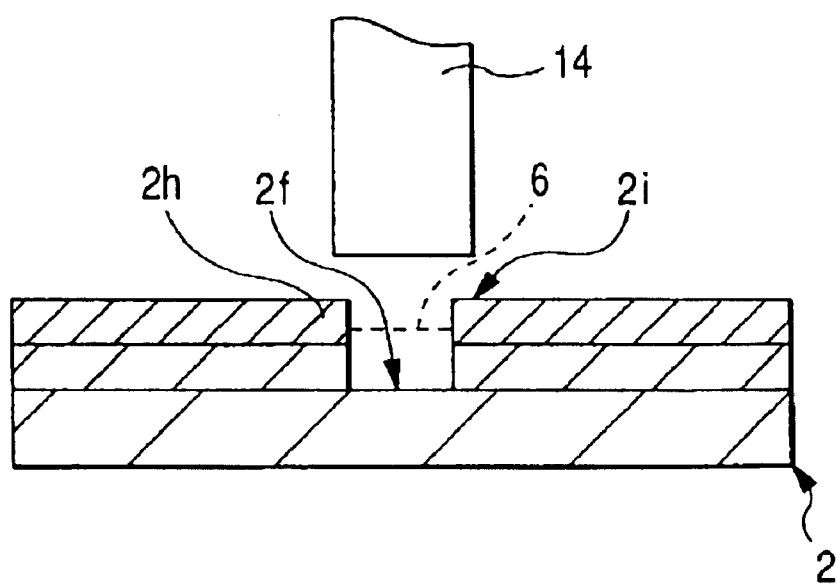
FIG. 24 is a partial sectional view showing an example of a positional relation among stepped portions, a semiconductor chip, and a nozzle in the sectional structure illustrated in FIG. 23.

FIG. 21 is a bottom view showing the structure of a wiring substrate used in a crystal oscillator module according to a second embodiment of the present invention, FIG. 22 is a plan view showing an internal structure of the wiring substrate illustrated in FIG. 21, FIG. 23 is a sectional view showing a sectional structure taken along line A—A in FIG. 22, and FIG. 24 is a partial sectional view showing an example of a positional relation among stepped portions, a semiconductor chip, and a nozzle in the sectional structure illustrated in FIG. 23.

A ceramic substrate 2 according to this second embodiment is smaller in size than the ceramic substrate 2 in the first embodiment. This ceramic substrate 2 is used in further reducing the size of the crystal oscillator module 5 shown in FIG. 1.

The ceramic substrate 2 has a recess 2c, stepped portions 2h formed in the surrounding portion of an opening 2e of the recess 2c and each having a first face 2i higher than a bottom 2f of the recess 2c, and a resin passage 2j adjacent to the stepped portions 2h and contiguous to the bottom 2f. The stepped portions 2h are formed by a partial interruption of the surrounding portion of the opening 2e. The first surface 2i of each stepped portion 2h is formed with a corner 2m constituted by two different sides.

In carrying out the underfill sealing, therefore, the nozzle 14 is disposed so as to partially overlap the corners 2m of the first faces 2i of the stepped portions 2h, and thereafter the resin 15 (see FIG. 10) is dropped from the nozzle 14 onto the corners 2m of the first faces 2i.

The resin 15 thus dropped onto the corners 2m flows down onto the resin passage 2j along the corners 2m of the stepped portions 2h, then passes the resin passage 2j and gets in between the bottom 2f of the ceramic substrate 2 and the driver IC 6.

With use of the ceramic substrate 2 according to the modification illustrated in FIGS. 21 to 24, when positioning the nozzle 14, the nozzle can be positioned easily above the corners 2m of the stepped portions 2h and thus the efficiency of the underfill sealing work can be improved as in the first embodiment.

Particularly, also in assembling the crystal oscillator module (see FIG. 1) which is reduced in size, it is possible to improve the efficiency of the underfill sealing work.

It is preferable that the distance between the corners 2m of the interrupted stepped portions 2h be not longer than the diameter of the nozzle 14.

With such a distance, it suffices to perform positioning of the nozzle 14 so as to overhang the corner 2m of at least one stepped portion 2h, thus permitting easy positioning of the nozzle.

As to other structural points and how to manufacture the semiconductor device, as well as other effects, in the use of the ceramic substrate 2 according to the second embodiment of the present invention, they are the same as in the first embodiment illustrated in FIGS. 1 to 4, so tautological explanations thereof will here be omitted.

The following description is now provided about a modification of the second embodiment.

Figure 25:
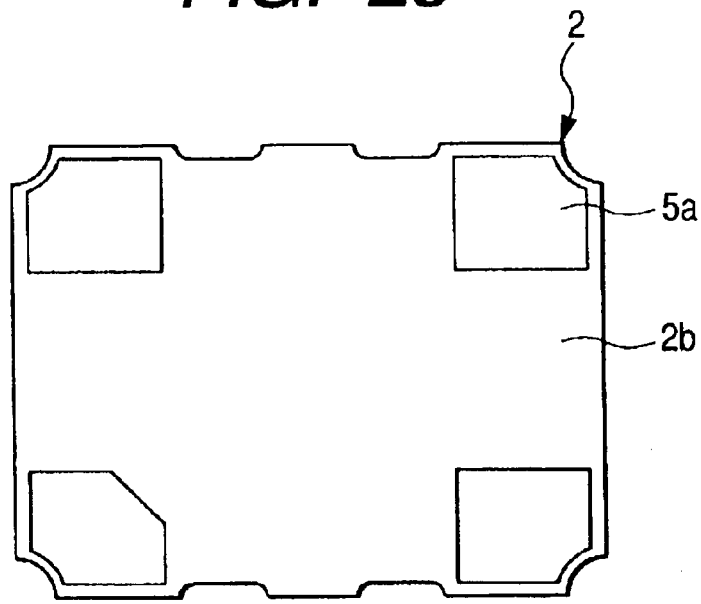
FIG. 25 is a bottom view showing the structure of a wiring substrate used in a crystal oscillator module according to a modification of the second embodiment of the present invention.
Figure 26:
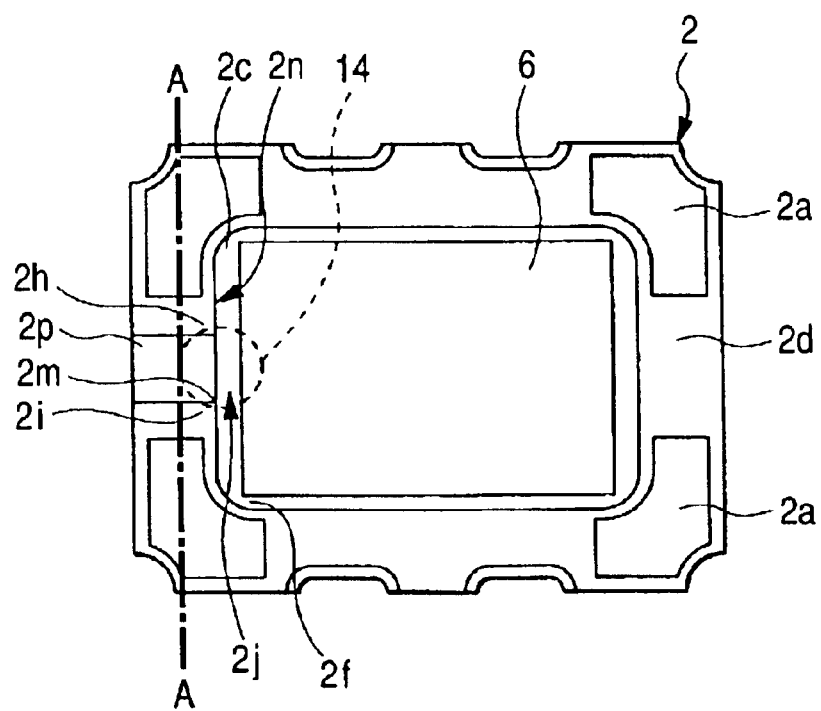
FIG. 26 is a plan view showing an internal structure of the wiring substrate illustrated in FIG. 25.
Figure 27:
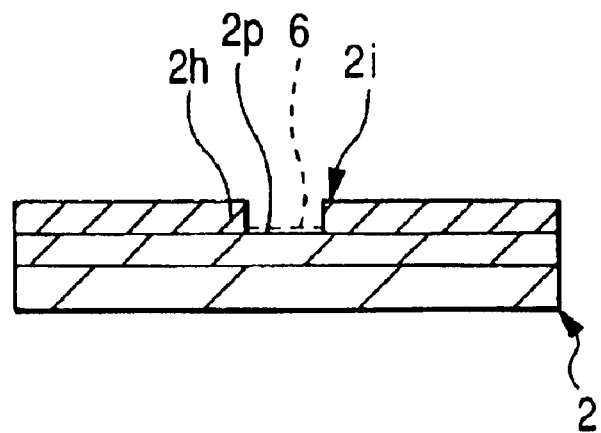
FIG. 27 is a sectional view showing a sectional structure taken along line A—A in FIG. 26.
Figure 28:
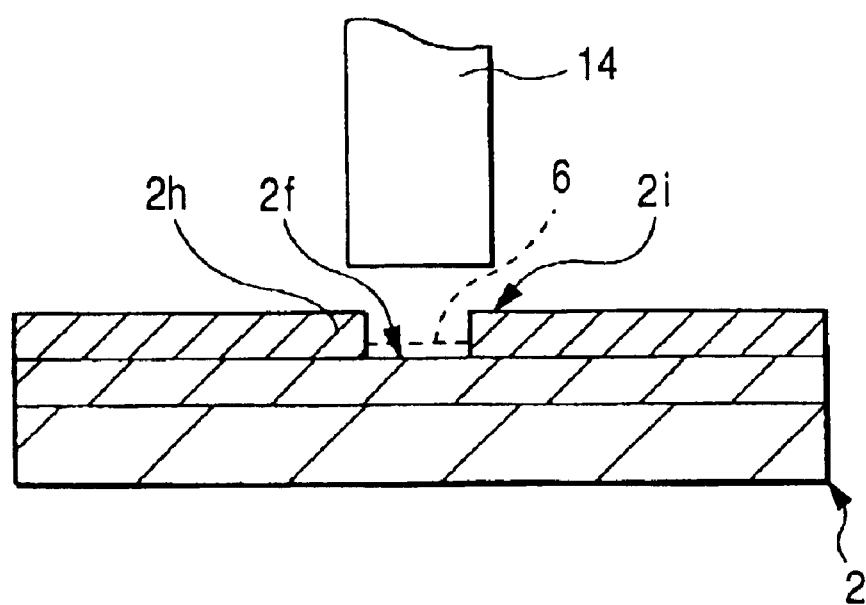
FIG. 28 is a partial sectional view showing an example of a positional relation among stepped portions, a semiconductor chip, and a nozzle in the sectional structure illustrated in FIG. 27.

FIG. 25 is a bottom view showing the structure of a wiring substrate used in a crystal oscillator module according to a modification of the second embodiment of the present invention, FIG. 26 is a plan view showing an internal structure of the wiring substrate illustrated in FIG. 25, FIG. 27 is a sectional view showing a sectional structure taken along line A—A in FIG. 26, and FIG. 28 is a partial sectional view showing an example of a positional relation among stepped portions, a semiconductor chip, and a nozzle in the sectional structure illustrated in FIG. 27.

A ceramic substrate 2 shown in FIGS. 25 to 28 is of about the same shape as the ceramic substrate shown in FIGS. 21 to 24 and it is used when the crystal oscillator module 5 shown in FIG. 1 is to be further reduced in size. In this ceramic substrate 2, a middle stepped portion 2p lower than the stepped portions 2h and higher than the bottom 2f is formed at the interrupted portion between the stepped portions 2h.

According to this construction, when the resin 15 (see FIG. 10) is dropped onto the corners 2m of the first faces 2i of the stepped portions 2h, it is also dropped inevitably onto the middle stepped portion 2p and the resin passage 2j, so that it becomes easier for the resin 15 to flow along the corners 2m of the stepped portions 2h and hence it is possible to stabilize the underfill sealing.

As to other structural points and other effects in the use of the ceramic substrate 2 according to the modification illustrated in FIGS. 25 to 28, they are the same as in the use of the ceramic substrate illustrated in FIGS. 21 to 24, so tautological explanations thereof will here be omitted.

Figure 29:
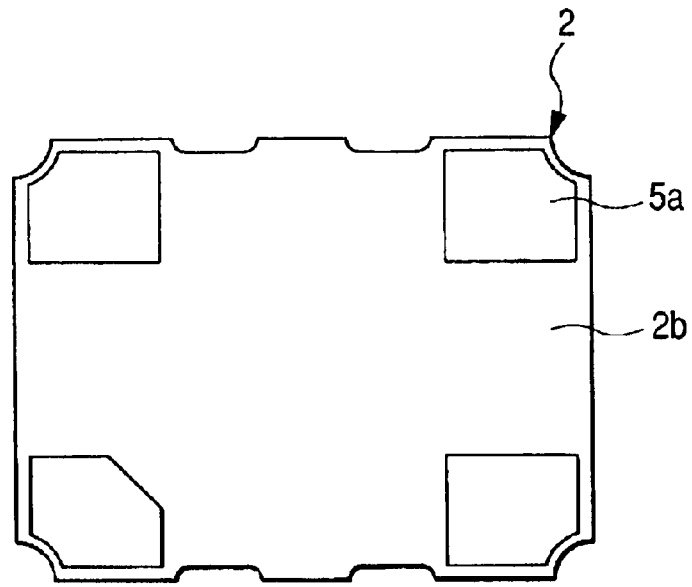
FIG. 29 is a bottom view showing the structure of a wiring substrate used in a crystal oscillator module according to another modification of the second embodiment of the present invention.
Figure 30:
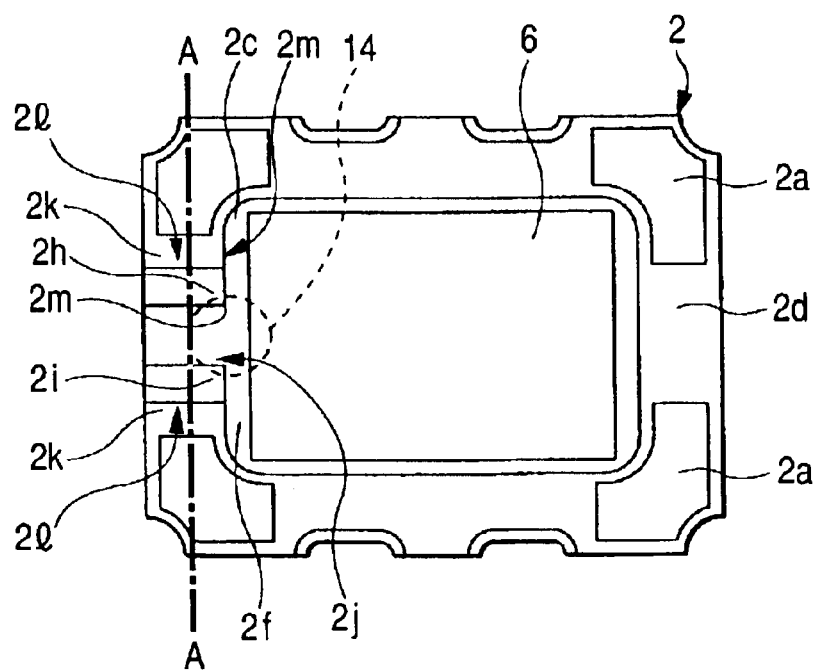
FIG. 30 is a plan view showing an internal structure of the wiring substrate illustrated in FIG. 29.
Figure 31:
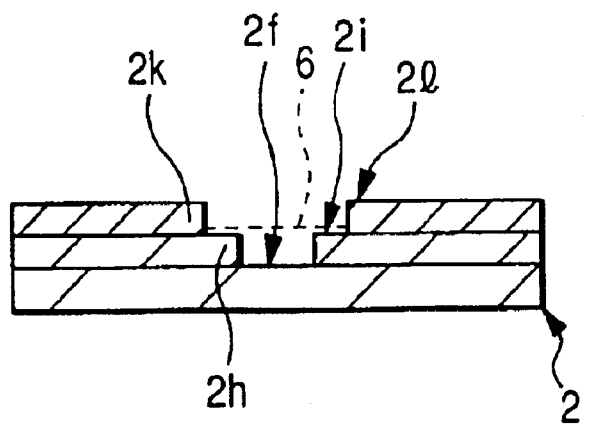
FIG. 31 is a sectional view showing a sectional structure taken along line A—A in FIG. 30.
Figure 32:
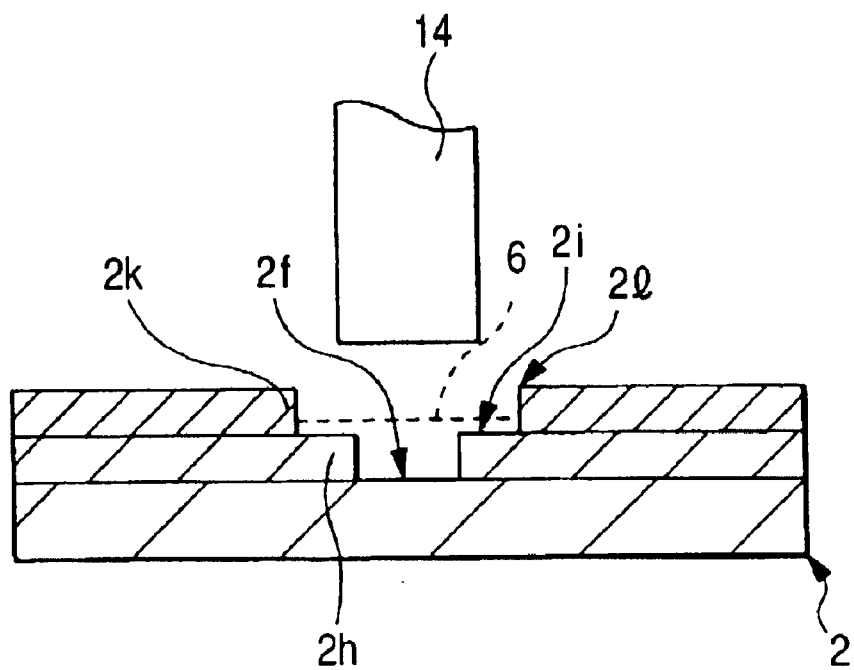
FIG. 32 is a partial sectional view showing a positional relation among stepped portions, a semiconductor chip, and a nozzle in the sectional structure illustrated in FIG. 31.

FIG. 29 is a bottom view showing the structure of a wiring substrate used in a crystal oscillator module according to another modification of the second embodiment of the present invention, FIG. 30 is a plan view showing an internal structure of the wiring substrate illustrated in FIG. 29, FIG. 31 is a sectional view showing a sectional structure taken along line A—A in FIG. 30, and FIG. 32 is a partial sectional view showing an example of a positional relation among stepped portions, a semiconductor chip, and a nozzle in the sectional structure of FIG. 31.

Also as to a ceramic substrate according to the modification illustrated in FIGS. 29 to 32, it is about the same in shape as the ceramic substrate 2 illustrated in FIGS. 21 to 24 and is used when the crystal oscillator module illustrated in FIG. 1 is to be reduced in size. In the ceramic substrate according to this modification, second stepped portions 2k each having a second face 21 higher than the first face 2i are formed respectively on the interrupted stepped portions 2h, and oscillator connecting terminals 2a are provided on the second faces 21.

According to this construction, since the second faces 21 of the second stepped portions 2k are higher than the first faces 2i of the stepped portions 2h, it is possible to prevent resin 15 (see FIG. 10) from flowing out onto the second faces 21 of the second stepped portions 2k when it is dropped onto the corners 2m of the first faces 2i, whereby the oscillator connecting terminals 2a formed on the second faces 21 of the edge portion 2d can be prevented from being stained by the resin 15.

Other structural points and effects in the use of the ceramic substrate 2 according to the modification illustrated in FIGS. 29 to 32 are the same as in the use of the ceramic substrate 2 illustrated in FIGS. 21 to 24, so tautological explanations thereof will here be omitted.

(Third Embodiment)

Figure 33:
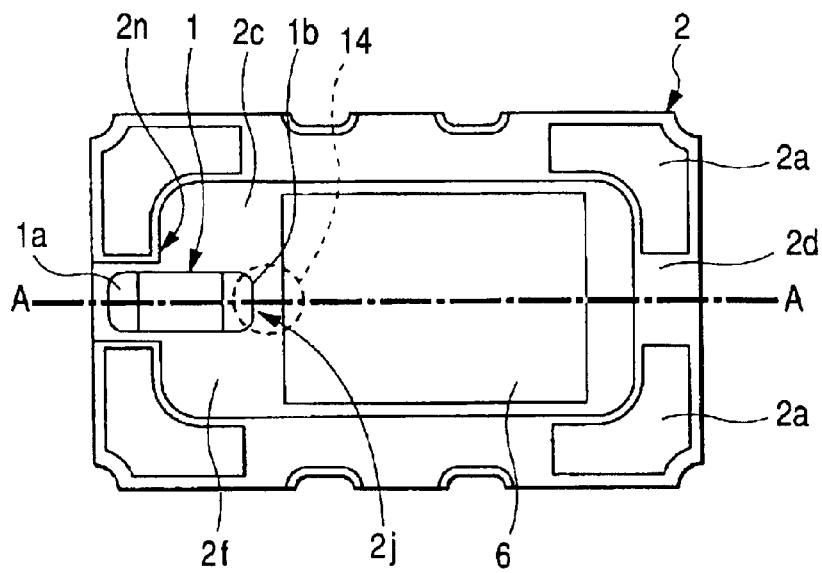
FIG. 33 is a plan view showing the structure of a wiring substrate used in a crystal oscillator module according to a third embodiment of the present invention.
Figure 34:
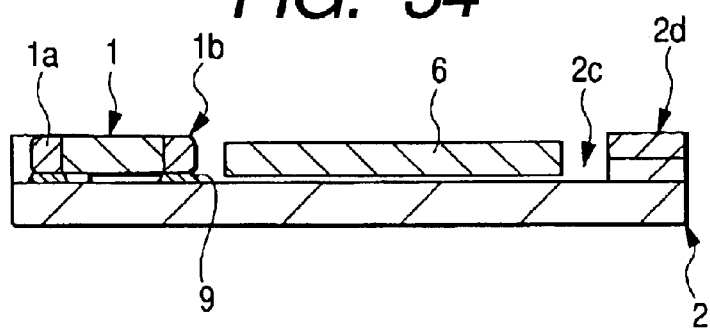
FIG. 34 is a sectional view showing a sectional structure taken along line A—A in FIG. 33.
Figure 35:
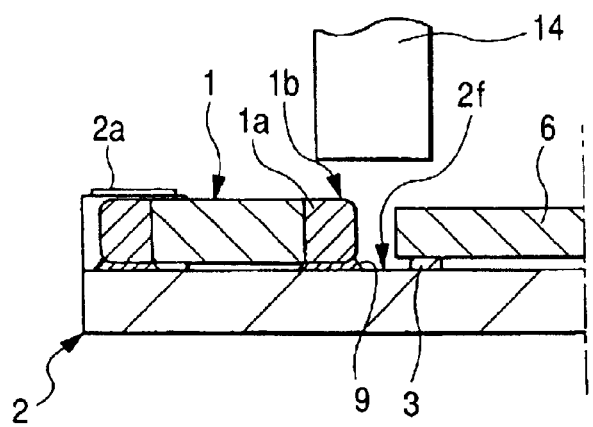
FIG. 35 is a partial sectional view showing an example of a positional relation among a chip part, a semiconductor chip, and a nozzle in the sectional structure illustrated in FIG. 34.

FIG. 33 is a plan view showing the structure of a wiring substrate used in a crystal oscillator module according to a third embodiment of the present invention, FIG. 34 is a sectional view showing a sectional structure taken along line A—A in FIG. 33, FIG. 35 is a partial sectional view showing an example of a positional relation among a chip part, a semiconductor chip, and a nozzle in the sectional structure FIG. 34, and FIG. 36 is a manufacturing process flow chart showing an example of an assembling procedure in the crystal oscillator module manufacturing method illustrated in FIG. 33.

According to this third embodiment, in the crystal oscillator module 5 illustrated in FIG. 1, a chip capacitor 1 as a chip part is mounted within the recess 2c of the ceramic substrate 2 together with the driver IC 6.

To be more specific, as shown in FIGS. 33 and 34, a chip capacitor 1 as a chip part is mounted in the recess 2c of the ceramic substrate 2 and also between the interrupted stepped portions 2h formed in the surrounding portion of the opening 2e of the recess. Thus, the crystal oscillator module 5 is intended to attain both mounting of the chip capacitor 1 and reduction of size.

As shown in FIG. 35, part terminals 1a formed at both ends of the chip capacitor 1 are connected electrically to the ceramic substrate 2 through solder connections 9.

It is preferable that the chip capacitor 1 be mounted at a height slightly larger than the height of the driver IC 6.

In mounting the chip capacitor 1, as shown in FIG. 36, solder is supplied in step S101 and thereafter the chip capacitor 1 is mounted into the recess 2c of the ceramic substrate 2.

More specifically, solder is fed to the ceramic substrate 2 and then the chip capacitor 1 is disposed onto the solder (step S102).

Thereafter, reflow is performed in step S103, allowing the part terminals 1a of the chip capacitor 1 and the ceramic substrate 2 to be soldered together to form connections 9, as shown in FIG. 35.

In this way the chip capacitor 1 is mounted in the recess 2c of the ceramic substrate 2.

Then, the step S3 and subsequent steps explained in the first embodiment are carried out to also mount the driver IC 6 within the recess 2c of the ceramic substrate 2.

Further, in the underfill pouring step S4, the nozzle 14 is disposed so as to overhang corners 1b of the chip capacitor 1 and then resin 15 (see FIG. 10) is dropped from the nozzle 14 onto the corners 1b of the chip capacitor, allowing the resin to be admitted between the bottom 2f of the ceramic substrate 2 and the driver IC 6 through the resin passage 2j.

As in this third embodiment, a chip part such as the chip capacitor 1 may be used instead of the projection 2g used in the first embodiment. In this case, the dropped resin 15 flows along a side portion of the chip capacitor 1 and reaches the resin passage 2j, then further flows into the gap between the ceramic substrate 2 and the driver IC 6.

In order that the resin 15 dropped onto the chip capacitor 1 may flow smoothly along a side portion of the chip capacitor and reach the resin passage 2j, it is preferable for the chip capacitor 1 to have a shape such that at least a plane area thereof is smaller than the area of the back surface of the driver IC 6. It is also preferable that the width of the chip capacitor 1 be smaller than the diameter of the nozzle 14.

According to this construction, as in the first embodiment, it is possible to improve the efficiency of the underfill sealing work and stabilize the underfill sealing.

Further, the chip capacitor 1 is disposed in an area of bottom 2f newly formed by scissioning the edge portion 2d of the ceramic substrate, so in comparison with the conventional structure which requires ensuring a chip capacitor mounting space in the area between the edge portion 2d and the driver IC 6, it is possible to attain both mounting of the chip capacitor 1 and the reduction in size of the module; besides, noise resistance can be improved by the mounting of the chip capacitor 1.

Although the present invention has been described above concretely by way of embodiments thereof, it goes without saying that the invention is not limited to the above embodiments, but that various changes may be made within the scope not departing from the gist of the invention.

For example, although in the above embodiments the semiconductor device is an oscillation device having the oscillator 12, the semiconductor device may be a package with the oscillator 12 not mounted thereon.

More particularly, the semiconductor device may be in the form of a package not provided with the oscillator 12 and, for example, the ceramic substrate 2 with the driver IC 6 carried thereon and the oscillator 12 may be mounted separately on a printed wiring substrate or the like.

Although in the above third embodiment, the chip capacitor 1 as a chip part is mounted on the ceramic substrate 2, followed by mounting of the driver IC 6 (a semiconductor chip), the mounting sequence may be changed such that the drive IC 6 is first mounted on the ceramic substrate 2, followed by mounting of the chip capacitor 1.

Moreover, the gold bumps 3 used in Au—Au connection at the time of connection of the driver IC 6 as a semiconductor chip are not limited to Au wires, but may be formed by Au plating or Au printing.

Although the chip part used in the third embodiment is the chip capacitor 1, it may be a chip resistor for example.

The present invention is applicable not only to the driver IC 6 for crystal oscillator and the semiconductor device using the same but also to a semiconductor device manufacturing method wherein, after flip chip connection of a semiconductor chip to the recess of the wiring substrate, there is performed underfill sealing for the semiconductor chip.

The following is a brief description of effect obtained by typical inventions disclosed herein.

Since the nozzle is positioned so as to overhang corners of a first face of stepped portions formed in part of the surrounding portion of the recess of the wiring substrate and thereafter resin is dropped from the nozzle onto the corners of the stepped portions, the resin flows down along the corners of the stepped portions and passes the resin passage, then flows into the gap between the wiring substrate and the semiconductor chip. In this case, positioning the nozzle above the corners of the stepped portions can be controlled relatively easily, so that the underfill sealing work is no longer troublesome and it is possible to improve the efficiency of the same work.

What is claimed is:

1. A method of manufacturing a semiconductor device wherein a sealing resin is dropped from a nozzle and is admitted between a semiconductor chip and a wiring substrate, said method comprising the steps of:

providing said wiring substrate having: a recess; a stepped portion; and a resin passage, said stepped portion being formed in part of said recess and having a first face higher than a bottom of the recess, said resin passage being adjacent to said stepped portion and contiguous to the bottom of said recess;

providing said semiconductor chip having salient electrodes;

flip-chip-connecting said semiconductor chip to the recess of said wiring substrate;

disposing said nozzle so as to partially overhang a corner portion of the first face of said stepped portion; and dropping the resin from said nozzle onto the corner portion of said stepped portion, allowing the resin to be admitted between the bottom of said wiring substrate and said semiconductor chip through said resin passage.

2. The method according to claim 1, wherein said stepped portion is formed in a partially interrupted form of a surrounding portion of said recess, the length of the interrupted portion of said stepped portion being not larger than the diameter of said nozzle.

3. The method according to claim 1, wherein the first face of said stepped portion is higher than a surface of said semiconductor chip.

4. The method according to claim 1, wherein said stepped portion is formed in a partially interrupted form of a surrounding portion of said recess, a second stepped portion having a second face higher than said first face is formed stackedly on said stepped portion, and electrodes are formed on said second face of said second stepped portion.

5. The method according to claim 1, wherein the distance between an end portion of said semiconductor chip and an end portion of said wiring substrate on the side where said nozzle is disposed is longer than the distance between an opposite end portion of the semiconductor chip and an opposite end portion of the wiring substrate on the side opposite to the nozzle-disposed side.

6. The method according to claim 1, wherein a ceramic substrate is used as said wiring substrate.

7. A method of manufacturing a semiconductor device wherein a sealing resin is dropped from a nozzle and is admitted between a semiconductor chip and a wiring substrate, said method comprising the steps of:

providing said wiring substrate having: a recess; a projection adjacent to an inner periphery wall of said recess and having a first face higher than a bottom of said recess; and a resin passage formed on the bottom of said recess adjacently to said projection;

providing said semiconductor chip having salient electrodes;

flip-chip-connecting said semiconductor chip to the recess of said wiring substrate;

disposing said nozzle so as to partially overhang a corner portion of said first face of said projection; and dropping the resin from said nozzle onto the corner portion of said projection, allowing the resin to be admitted between the bottom of said wiring substrate and said semiconductor chip through said resin passage.

8. The method according to claim 7, wherein the area of said projection is not larger than a sectional area of said nozzle.

9. The method according to claim 7, wherein the area of said projection is not larger than a sectional area of a resin ball which is formed at a tip of said nozzle at the time of dropping the resin from the nozzle.

10. The method according to claim 7, wherein said nozzle is disposed so as to overhang the corner portion of the first face of said projection and also overhang a part of said semiconductor chip, and in this state the resin is dropped from the nozzle.

11. The method according to claim 7, wherein said nozzle is disposed above the corner portion of the first face of said projection and also above said resin passage in such a manner that the area of the nozzle overhanging the resin passage is larger than the area thereof overhanging the projection, and in this state the resin is dropped from the nozzle.

12. The method according to claim 7, wherein a second face higher than said first face of said projection is formed around an opening of said recess adjacent to the projection, and electrodes are formed on said second face.

13. The method according to claim 7, wherein said first face of said projection is higher than a surface of said semiconductor chip.

14. The method according to claim 7, wherein said semiconductor chip is flip-chip-connected to said recess of said wiring substrate at a position offset in a direction leaving said projection.

15. A method of manufacturing a semiconductor device wherein a sealing resin is dropped from a nozzle and is admitted between a semiconductor chip and a wiring substrate, said method comprising the steps of:

providing said wiring substrate having: a recess; a stepped portion; and a resin passage, said stepped portion being formed in a partially interrupted form of a surrounding portion of an opening of said recess, said resin passage being formed on a bottom of said recess, adjacently to the interrupted portion of said stepped portion;

providing said semiconductor chip having salient electrodes;

mounting a chip part in the interrupted portion of said stepped portion formed in the surrounding portion of said recess of said wiring substrate;

flip-chip-connecting said semiconductor chip to the recess of said wiring substrate;

disposing said nozzle so as to overhang a corner portion of said chip part; and dropping the resin from said nozzle onto the corner portion of said chip part, allowing the resin to be admitted between the bottom of said wiring substrate and said semiconductor chip through said resin passage.

16. The method according to claim 15, wherein said nozzle is disposed so as to overhang two corners of said chip part and also overhang said semiconductor chip, and in this state the resin is dropped onto both said chip part and said semiconductor chip.

17. The method according to claim 15, wherein the height of said chip part is larger than that of said semiconductor chip.

18. A method of manufacturing a semiconductor device wherein a sealing resin is dropped from a nozzle and is admitted between a semiconductor chip and a wiring substrate, said method comprising the steps of:

providing said wiring substrate having: a recess; a projection adjacent to an inner periphery wall of said recess and having a first face higher than a bottom of said recess; and a resin passage formed on said bottom of the recess adjacently to said projection;

providing said semiconductor chip having salient electrodes;

flip-chip-connecting said semiconductor chip to the recess of said wiring substrate;

disposing said nozzle so as to partially overhang a corner portion of said first face of said projection;

dropping the resin from said nozzle onto the corner portion of said projection, allowing the resin to be admitted between the bottom of said wiring substrate and said semiconductor chip through said resin passage; and connecting an oscillator having a crystal resonator to electrodes through solder, said electrodes being formed on a second face formed around said recess and higher than said first face.

19. The method according to claim 18, wherein the area of said projection is not larger than a sectional area of said nozzle.

20. The method according to claim 18, wherein the area of said projection is not larger than a sectional area of a resin ball which is formed at a tip of said nozzle at the time of dropping the resin from the nozzle.

21. The method according to claim 18, wherein said nozzle is disposed above the corner portion of the first face of said projection and also above said resin passage in such a manner that the area of the nozzle overhanging the resin passage is larger than the area thereof overhanging the projection, and in this state the resin is dropped from the nozzle.

22. The method according to claim 18, wherein said first face of said projection is higher than a surface of said semiconductor chip.

23. A method of manufacturing a semiconductor device wherein a sealing resin is dropped from a nozzle and is admitted between a semiconductor chip and a wiring substrate, said method comprising the steps of:

providing said wiring substrate having: a recess; a stepped portion; and a resin passage, said stepped portion being formed in part of a surrounding portion of said recess and having a first face higher than a bottom of the recess, said resin passage being adjacent to said stepped portion and contiguous to the bottom of said recess;

providing said semiconductor chip having salient electrodes;

flip-chip-connecting said semiconductor chip to the recess of said wiring substrate;

disposing said nozzle so as to partially overhang a corner portion of said first face of said stepped portion, said corner portion being formed by two different sides; and dropping the resin from said nozzle onto the corner portion of said stepped portion, allowing the resin to flow along the stepped portion onto said resin passage from said corner portion and allowing it to be admitted between the bottom of said wiring substrate and said semiconductor chip.

24. The method according to claim 23, wherein said nozzle is disposed so as to overhang the corner portion of said first face of said stepped portion and also overhang said semiconductor chip, and in this state the resin is dropped from the nozzle.

25. The method according to claim 23, wherein the semiconductor chip is flip-chip-connected to said recess of said wiring substrate at a position offset in a direction leaving said stepped portions.

26. A method of manufacturing a semiconductor device, comprising the steps of:

providing a wiring substrate having: a first main surface; a second main surface formed at a position higher than said first main surface and having a corner portion constituted by two different sides; a third main surface formed outside said first and second main surfaces and at a position higher than said first main surface; a plurality of first electrodes formed on said first main surface; and a plurality of second electrodes formed on said third main surface;

providing a semiconductor chip, said semiconductor chip having a main surface formed with a plurality of semiconductor elements and also having a plurality of salient electrodes formed on said main surface;

disposing said semiconductor chip so that the main surface thereof confronts the first main surface of said wiring substrate, and connecting said plural salient electrodes and said plural first electrodes electrically with each other; and after said semiconductor chip disposing step, disposing said nozzle above said corner portion and dropping resin from said nozzle, allowing the resin to be admitted between said main surface of said semiconductor chip and said first main surface of said wiring substrate through said corner portion.

27. The method according to claim 26, wherein said second main surface is formed at a position lower than said third main surface.

28. The method according to claim 26, wherein said second main surface is formed at a position higher than a back surface opposite to the main surface of said semiconductor chip disposed on said wiring substrate.

29. The method according to claim 26, wherein said semiconductor chip is disposed in such a manner that the first main surface of a portion adjacent to said corner portion is not covered with the semiconductor chip.

30. The method according to claim 29, wherein the portion of the first main surface adjacent to said corner portion and exposed without being covered with said semiconductor chip is larger in width than said second main surface.

31. A method of manufacturing a semiconductor device, comprising the steps of:

providing a wiring substrate having: a first main surface; a second main surface formed at a position outside and higher than said first main surface and having a first corner portion constituted by two different sides; a plurality of first electrodes formed on said first main surface; and a plurality of second electrodes formed on said second main surface;

providing a semiconductor chip, said semiconductor chip having a main surface formed with a plurality of semiconductor elements and also having a plurality of salient electrodes formed on said main surface;

disposing said semiconductor chip so that the main surface thereof confronts the first main surface of said wiring substrate, and connecting said plural salient electrodes and said plural first electrodes electrically with each other; and after said semiconductor chip disposing step, disposing said nozzle above said first corner portion and dropping resin from said nozzle, allowing the resin to be filled between said main surface of said semiconductor chip and said first main surface of said wiring substrate through said first corner portion.

32. The method according to claim 31, wherein said second main surface further has a second corner portion constituted by two different sides, and the filling of the resin is performed through a portion of said first main surface formed between said first and second corner portions.

33. The method according to claim 32, wherein the spacing between said first corner portion and said second corner portion is smaller than the diameter of said nozzle, said nozzle is disposed also above said second corner portion simultaneously with being disposed above said first corner portion, and the filling of the resin is performed also through said second corner portion.

34. A method of manufacturing a semiconductor device, comprising the steps of:

providing a wiring substrate having: a first main surface; a second main surface formed at a position higher than said first main surface; a plurality of first electrodes formed on said first main surface; and a plurality of second electrodes formed on said second main surface;

providing a semiconductor chip, said semiconductor chip having a main surface formed with a plurality of semiconductor elements and also having a plurality of salient electrodes formed on said main surface;

providing a chip part having a plane area smaller than that of said semiconductor chip and having a plurality of electrodes;

disposing said semiconductor chip so that the main surface thereof confronts the first main surface of said wiring substrate, and connecting said plural salient electrodes and said plural first electrodes electrically with each other;

disposing said chip part on said first main surface and connecting said plural electrodes of said chip part and said first plural electrodes electrically with each other; and after said semiconductor chip and chip part disposing steps, disposing said nozzle above said chip part and dropping resin from said nozzle, allowing the resin to be filled between said main surface of said semiconductor chip and said first main surface of said wiring substrate through said chip part.

35. The method according to claim 34, wherein said second main surface is formed in a partially interrupted form along the periphery of said first main surface, and said chip part is disposed on said first main surface in the interrupted area of said second main surface.

* * * * *